(12) United States Patent
Deak et al.

(10) Patent No.: US 11,512,939 B2
(45) Date of Patent: Nov. 29, 2022

(54) SINGLE-CHIP DOUBLE-AXIS MAGNETORESISTIVE ANGLE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

(*) Notice: Subject to any disclaimer, the term of this patent is extended or adjusted under 35 U.S.C. 154(b) by 579 days.

(21) Appl. No.: 16/488,549

(22) PCT Filed: Feb. 14, 2018

(86) PCT No.: PCT/CN2018/076783
§ 371 (c)(1),
(2) Date: Aug. 23, 2019

(87) PCT Pub. No.: WO2018/153335
PCT Pub. Date: Aug. 30, 2018

(65) Prior Publication Data
US 2019/0368858 A1    Dec. 5, 2019

(30) Foreign Application Priority Data

Feb. 23, 2017   (CN) .......................... 201710099463.1

(51) Int. Cl.
*G01B 7/30* (2006.01)
*G01R 33/09* (2006.01)

(52) U.S. Cl.
CPC .............. *G01B 7/30* (2013.01); *G01R 33/091* (2013.01); *G01R 33/093* (2013.01); *G01R 33/096* (2013.01); *G01R 33/098* (2013.01)

(58) Field of Classification Search
CPC ...... G01B 7/30; G01R 33/091; G01R 33/093; G01R 33/096; G01R 33/098
See application file for complete search history.

(56) References Cited

U.S. PATENT DOCUMENTS 6,129,957 A    10/2000    Xiao et al.
9,891,292 B2    2/2018    Deak
(Continued)

FOREIGN PATENT DOCUMENTS

CN    101969098        2/2011
CN    102208530 A    10/2011
(Continued)

OTHER PUBLICATIONS

Dicke, Zhou, CN104776794 machine translation, Apr. 2015 (Year: 2015).*

(Continued)

*Primary Examiner* — Alexander Satanovsky
*Assistant Examiner* — Sharah Zaab
(74) *Attorney, Agent, or Firm* — Schwegman Lundberg & Woessner, P.A.

(57) ABSTRACT

A single-chip two-axis magnetoresistive angle sensor comprises a substrate located in an X-Y plane, a push-pull X-axis magnetoresistive angle sensor and a push-pull Y-axis magnetoresistive angle sensor located on the substrate. The push-pull X-axis magnetoresistive angle sensor comprises an X push arm and an X pull arm. The push-pull Y-axis magnetoresistive angle sensor comprises a Y push arm and a Y pull arm. Each of the X push, X pull, Y push arm, and Y pull arms comprises at least one magnetoresistive angle sensing array unit. The magnetic field sensing directions of the magnetoresistive angle sensing array units of the X push, X pull, Y push, and Y pull arms are along +X, −X, +Y and −Y directions respectively. Each magnetoresistive sensing unit comprises a TMR or GMR spin-valve having the same magnetic multi-layer film structure. A magnetization direction of an anti-ferromagnetic layer is set into a desired orientation through the use of a laser controlled magnetic annealing, and a magnetic field attenuation layer can be (Continued)

deposited in the surface of the magnetoresistance angle sensing unit.

13 Claims, 9 Drawing Sheets

(56) References Cited

U.S. PATENT DOCUMENTS

| | | | | |
|---|---|---|---|---|
| 10,907,991 | B2* | 2/2021 | Binder | G01B 7/003 |
| 2006/0103381 | A1* | 5/2006 | Schmollngruber | F01L 1/00 |
| | | | | 324/252 |
| 2009/0260719 | A1 | 10/2009 | Iben et al. | |
| 2012/0112741 | A1* | 5/2012 | Meguro | G01B 7/30 |
| | | | | 324/252 |
| 2015/0285661 | A1* | 10/2015 | Ausserlechner | G01D 5/16 |
| | | | | 324/207.21 |
| 2017/0123016 | A1 | 5/2017 | Deak | |
| 2017/0211935 | A1 | 7/2017 | Deak et al. | |

FOREIGN PATENT DOCUMENTS

| | | | |
|---|---|---|---|
| CN | 103954920 | | 7/2014 |
| CN | 104280700 | * | 1/2015 |
| CN | 104776794 | * | 4/2015 |
| CN | 204389663 | * | 6/2015 |
| CN | 104776794 | | 7/2015 |
| CN | 106324534 | A | 1/2017 |
| CN | 106871778 | A | 6/2017 |
| CN | 206627062 | U | 11/2017 |
| DE | 10117355 | A1 | 10/2002 |
| DE | 102015206075 | * | 10/2015 |
| EP | 3285041 | A1 | 2/2018 |
| WO | WO-2016165578 | | 10/2016 |
| WO | WO-2018153335 | A1 | 8/2018 |

OTHER PUBLICATIONS

Dicke,Zhou, CN204389663 machine translation, Jun. 2015 (Year: 2015).*

Ausserlechner, Udo DE102015206075 machine translation, Oct. 2015 (Year: 2015).*

Dicke, James CN104280700 machine translation, Jan. 2015 (Year: 2015).*

"International Application No. PCT/CN2018/076783, International Search Report and Written Opinion dated May 22, 2018", (May 22, 2018), 16 pgs.

"European Application No. 18757297.9, Extended European Search Report dated Nov. 18, 2020", (Nov. 18, 2020), 9 pgs.

* cited by examiner

SINGLE-CHIP DOUBLE-AXIS MAGNETORESISTIVE ANGLE SENSOR

PRIORITY CLAIM TO RELATED APPLICATIONS

This application is a U.S. national stage filing under 35 U.S.C. § 371 from International Application No. PCT/CN2018/076783, filed on 14 Feb. 2018, and published as WO2018/153335 on 30 Aug. 2018, which claims the benefit under 35 U.S.C. 119 to Chinese Application No. 201710099463.1, filed on 23 Feb. 2017, the benefit of priority of each of which is claimed herein, and which applications and publication are hereby incorporated herein by reference in their entirety.

TECHNICAL FIELD

The present invention relates to the field of magnetic sensors, and in particular, to a single-chip double-axis magnetoresistive angle sensor.

BACKGROUND

Double-axis angle sensors for measuring external magnetic field angle information in two orthogonal directions, such as X and Y directions, can be used for magnetic wheel speed measurement or encoder angle measurement, and are commonly used for various applications.

A double-axis magnetoresistive angle sensor includes two single-axis magnetoresistive angle sensors, i.e., an X-axis magnetoresistive angle sensor and a Y-axis magnetoresistive angle sensor. Each single-axis X or Y magnetoresistive angle sensor generally adopts a push-pull bridge structure to enhance the signal output of the magnetoresistive angle sensor. The push-pull bridge consists of a push magnetoresistive angle sensing unit and a pull magnetoresistive angle sensing unit which have opposite magnetic field sensitive directions.

For the TMR- or GMR-type double-axis magnetoresistive angle sensor, a magnetoresistive sensing unit chip with a single magnetic field sensitive direction such as X-axis is usually flipped by 90, 180 and 270 degrees, respectively, thus obtaining a Y-axis push magnetoresistive sensing unit chip and a Y-axis pull magnetoresistive sensing unit chip, as well as an X-axis push magnetoresistive sensor unit chip and an X-axis pull magnetoresistive sensing unit chip. Therefore, at least 4 chips are needed when the flipped chip method is adopted for a double-axis magnetoresistive sensor. The advantage is that the preparation method is simple, and only one chip is needed and corresponds to a ferromagnetic reference layer structure. The disadvantage is that four chips need to be operated in the same plane for positioning, thus increasing the possibility of loss of sensor measuring accuracy caused by operation errors.

The push magnetoresistive sensing unit and the pull magnetoresistive sensing unit with opposite ferromagnetic reference layers can be fabricated by utilizing a ferromagnetic reference layer with a multi-layer film structure composed of ferromagnetic layers mutually coupled with anti-ferromagnetic layers and metal spacer layers. The orientation of an orthogonal ferromagnetic reference layer can be controlled using two different anti-ferromagnetic layers AF1 and AF2 after two-time magnetic field thermal annealing, the disadvantage of which is that the complexity of the micromachining process is increased because at least four multi-layer film structures and two-time magnetic field annealing are needed to deposit a multi-layer film.

The Chinese Patent Application No. CN201610821610.7 discloses a method of scanning laser program magnetic field annealing of a magnetoresistive sensing unit, which invovlvesrapidly heating an anti-ferromagnetic layer to above a blocking temperature, while a magnetic field is applied in any desired direction during the cooling process, which enables the development of of a magnetic field sensing direction of the magnetoresistive sensing unit fin a single chip. With this method, four orthogonally oriented magnetoresistive sensing units and an array thereof for a double-axis magnetoresistive sensing unit on a single chip can be manufactured, thereby overcoming the problems of precise positioning of flipped chips and the complexity of micromachining processes for depositing various magnetic multi-layer film structures, and single-chip double-axis magnetoresistive angle sensors can be mass-manufactured. On the other hand, the Chinese Patent Publication No. CN104776794A discloses a single-package high-intensity magnetic field magnetoresistive angle sensor, which increases the magnetic field measurement range of a magnetoresistive angle sensing unit by adding a magnetic field attenuation layer on the surface of the magnetoresistive angle sensing unit. The magnetoresistive angle sensor still uses the flipped chip method to change the magnetic field sensitive direction of the magnetoresistive sensing unit. Therefore, if a laser-assisted heating magnetic field annealing method is used to realize write-in operation of the magnetic field sensitive direction of the magnetoresistive sensing unit, a single-chip double-axis high-magnetic-field-strength magnetoresistive angle sensor can be obtained.

In addition, in the actual laser heating magnetic annealing process, the possible deviation from a circular shape, anisotropic dispersion, stress, and other factors of the magnetoresistive angle sensing unit during processing may cause the actual magnetization direction of the pinning layer to be deviated from the set +X, −X, +Y and −Y directions. Therefore, it is also required to set a range of an included angle between the magnetization directions of the pinning layers of the +X, −X-axis magnetoresistive angle sensing units and the +Y, −Y-axis magnetoresistive angle sensing units, to ensure efficient operation of the magnetoresistive angle sensing unit.

SUMMARY OF THE INVENTION

In order to solve the above problem, a single-chip magnetoresistive angle sensor proposed in the present invention includes a substrate in an X-Y plane, and a magnetoresistive angle sensor in a push-pull X-axis and a magnetoresistive angle sensor in a push-pull Y-axis both located on the substrate. The magnetoresistive angle sensor in a push-pull X-axis includes an X push arm and an X pull arm, the magnetoresistive angle sensor in a push-pull Y-axis includes a Y push arm and a Y pull arm, and each of the X push arm, the X pull arm, the Y push arm, and the Y pull arm includes at least one magnetoresistive angle sensing unit array. Magnetic field sensitive directions of the magnetoresistive angle sensing unit arrays of the X push arm, the X pull arm, the Y push arm, and the Y pull arm are along +X, −X, +Y, and −Y directions, respectively. The X-axis magnetoresistive angle sensor and the Y-axis magnetoresistive angle sensor have a common geometric center, and each of the magnetoresistive angle sensing unit arrays includes a plurality of magnetoresistive angle sensing units. The magnetoresistive angle sensing unit is a TMR or GMR spin valve unit, and all the magnetoresistive angle sensing units have the same magnetic multi-layer film structure. The magnetic multi-layer film structure includes a seed layer, an anti-ferromagnetic layer, a pinning layer, a Ru layer, a reference layer, a non-magnetic intermediate layer, a free layer, and a passivation layer from the top down, or includes a seed layer, an anti-ferromagnetic layer, a reference layer, a non-magnetic intermediate layer, a free layer, and a passivation layer from the top down. When the magnetoresistive angle sensing unit is TMR, the non-magnetic intermediate layer is $Al_2O_3$ or MgO, and when the magnetoresistive angle sensing unit is a GMR spin valve, the non-magnetic intermediate layer is Au or Cu.

The magnetization direction of the anti-ferromagnetic layer is obtained by laser heating magnetic annealing. Magnetoresistive bridge arms with the same magnetization direction are located adjacent to each other, and a thermal-insulation gap is provided between adjacent magnetoresistive angle sensing unit arrays with different magnetic field sensitive directions.

Further, the magnetoresistive angle sensor in a push-pull X-axis and the magnetoresistive angle sensor in a push-pull Y-axis are a half-bridge, full-bridge or quasi-bridge structure.

Further, the magnetoresistive angle sensing unit arrays are arranged as:
+X, −Y, +Y, −X;
or +X, +Y, −Y, −X;
or −X, −Y, +Y, +X;
or +X, −Y, +Y, −X.

Further, a magnetic field attenuation layer is electroplated on the surface of the magnetoresistive angle sensing unit to form a high magnetic field angle sensor. The material of the magnetic field attenuation layer is a high-permeability soft magnetic alloy that contains one or more of Fe, Co, and Ni elements. An insulating material layer is provided between the magnetoresistive angle sensing unit and the magnetic field attenuation layer, the magnetic field attenuation layer is of a circular structure, the magnetoresistive angle sensing unit is of an elliptical structure, and the diameter of the magnetic field attenuation layer is greater than the major axis distance of the magnetoresistive angle sensing unit.

Further, a high magnetic field angle sensor is formed on the surface of the magnetoresistive angle sensing unit; the magnetic field attenuation layer is of a circular structure, the magnetoresistive angle sensing unit is of a circular structure, the diameter of the magnetoresistive angle sensing unit is greater than 10 microns, and the diameter of the magnetic field attenuation layer is greater than that of the magnetoresistive angle sensing unit.

Further, the X push arm, the X pull arm, the Y push arm and the Y pull arm include the same number of magnetoresistive angle sensing units having the same resistance, and the magnetoresistive angle sensing units form a two-port structure by series, parallel or series-parallel hybrid connection.

Further, the magnetoresistive angle sensing unit arrays are connected by interconnecting wires, and the interconnecting wires include a straight segment and a meandering segment. One end of the straight segment is connected to the magnetoresistive sensing unit, the other end of the straight segment is connected to the meandering segment, and the distance from the meandering segment to the magnetoresistive angle sensing unit array is greater than 15 microns.

Further, an interconnecting wire connecting a common power supply terminal has the same interconnection resistance as an interconnecting wire connecting a common ground terminal, the interconnecting wire connecting the common power supply terminal has the same interconnection resistance as an interconnecting wire connecting a common signal output terminal, and the interconnecting wires obtain the same interconnection resistance through the straight segments and the meandering segments.

Further, an included angle between the magnetic field sensitive direction of the magnetoresistive angle sensing unit and the magnetization direction of the pinning layer ranges from 85° to 95°.

Further, the passivation layer is an ultraviolet laser transparent material that is BCB, $Si_3N_4$, $Al_2O_3$, $HfO_2$, $AlF_3$, $GdF_3$, $LaF_3$, $MgF_2$, $Sc_2O_3$, $HfO_2$, or $SiO_2$.

Further, the passivation layer is an infrared laser transparent material that is a diamond-like carbon film, MgO, SiN, SiC, $AlF_3$, $MgF_2$, $SiO_2$, $Al_2O_3$, $ThF_4$, ZnS, ZnSe, $ZrO_2$, $HfO_2$, $TiO_2$, $Ta_2O_7$, Si, or Ge.

Further, the magnetic multi-layer film structure further includes an anti-reflective coating covering the surface of the passivation layer.

Further, power supplies, ground, and output pins of the X-axis magnetoresistive angle sensor and the Y-axis magnetoresistive angle sensor are arranged along the edge of the sensor chip.

Compared with the prior art, the present invention has the following technical effects: the invention adopts a single chip structure and integrates two angle sensors on the same chip; and magnetoresistive angle sensing units of the two angle sensors have the same magnetic multi-layer film structure. The present invention has the advantages of compact structure, high precision, small size, and capability of realizing a large magnetic field working range.

DETAILED DESCRIPTION

To make the objectives, technical solutions, and advantages of embodiments of the present invention much clearer, the technical solutions in the embodiments of the present invention will be described clearly and completely below with reference to the accompanying drawings in the embodiments of the present invention. It is apparent that the described embodiments are some rather than all the embodiments of the present invention.

The present invention will be described in detail below with reference to the accompanying drawings in combination with embodiments.

Embodiment 1

Figure 1:
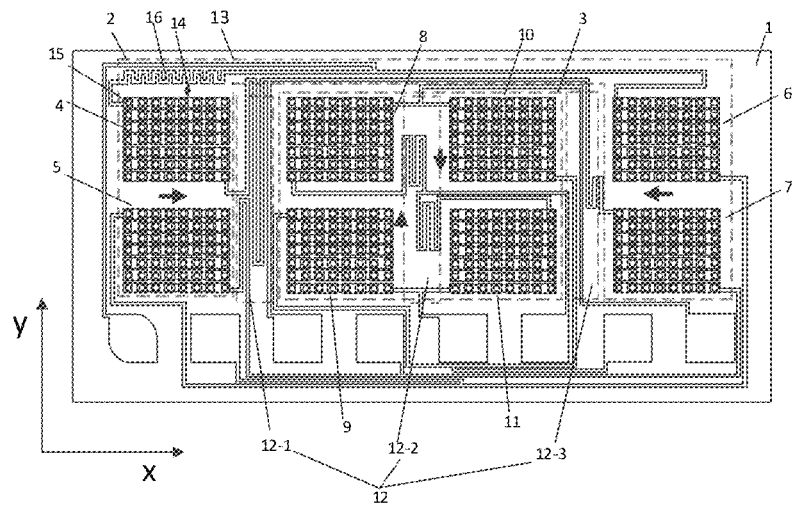
FIG. 1 is a schematic diagram of a single-chip double-axis magnetoresistive angle sensor according to the present invention.
Figure 2A:
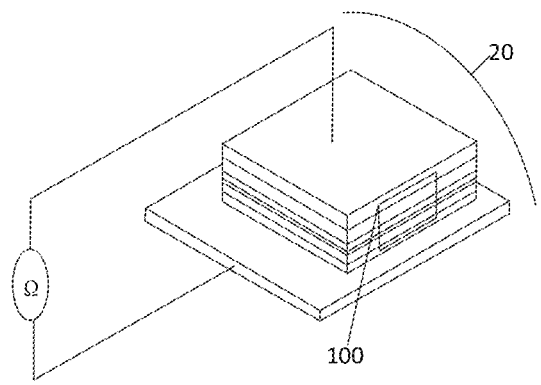
FIG. 2(a) is a magnetic multi-layer film structure of a magnetoresistive angle sensing unit.
Figure 2B:
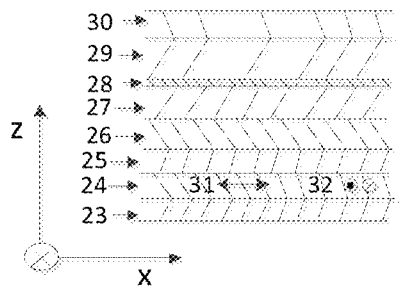
FIG. 2(b) is an enlarged structural diagram of 100 in FIG. 2(a)
Figure 2C:
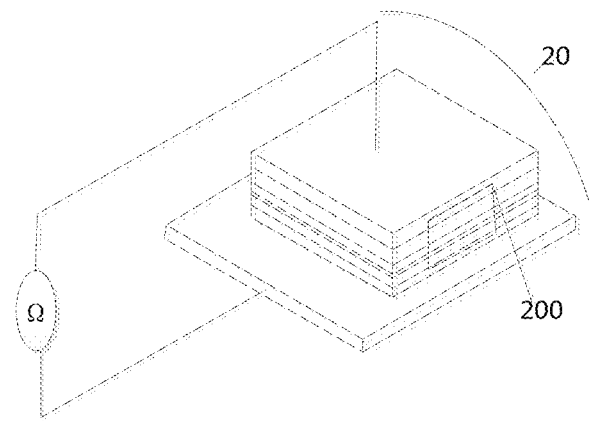
FIG. 2(c) is another magnetic multi-layer film structure of a magnetoresistive angle sensing unit.
Figure 2D:
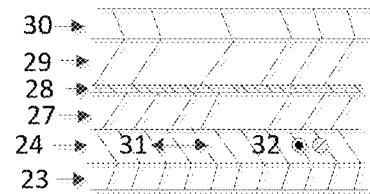
FIG. 2(d) is an enlarged structural diagram of 200 in FIG. 2(c)

FIG. 1 is a schematic diagram of a single-chip double-axis magnetoresistive angle sensor, which includes a substrate 1 on an X-Y plane, a magnetoresistive angle sensor 2 in a push-pull X-axis and a magnetoresistive angle sensor 3 in a push-pull Y-axis both located on the substrate 1. The X-axis magnetoresistive angle sensor 2 and the Y-axis magnetoresistive angle sensor 3 have a common geometric center, such that magnetic-field regions of the X-axis magnetoresistive sensor and the Y-axis magnetoresistive sensor measured on the substrate 1 have the same average value. The magnetoresistive angle sensor in a push-pull X-axis includes an X push arm and an X pull arm, and the magnetoresistive angle sensor in a push-pull Y-axis includes a Y push arm and a Y pull arm. The X push arm includes at least one magnetoresistive angle sensing unit array 4 and 5 of which the magnetic field sensitive direction is in the +X direction, and the X pull arm includes at least one magnetoresistive angle sensing unit array 6 and 7 of which the magnetic field sensitive direction is in the −X direction. The Y push arm includes at least one magnetoresistive angle sensing unit array 8 and 9 of which the magnetic field sensitive direction is in the +Y direction, and the Y push arm includes at least one magnetoresistive angle sensing unit array 10 and 11 of which the magnetic field sensitive direction is in the −Y direction.

As seen from FIG. 1, two adjacent magnetoresistive sensing unit arrays with different magnetic field sensitive directions, e.g., 4, 5 and 8, 9; 8, 9 and 10, 11; 10, 11 and 6, 7, are separated by thermal-insulation gaps 12-1, 12-2, 12-3, respectively. Specifically, the thermal-insulation gap 12-1 is provided between the magnetoresistive angle sensing unit array in the +X direction and the magnetoresistive angle sensing unit array in the +Y direction, that is, the thermal-insulation gap 12-1 is provided between the magnetoresistive angle sensing unit array 4 and the magnetoresistive angle sensing unit array 8, and between the magnetoresistive angle sensing unit array 5 and the magnetoresistive angle sensing unit array 8. Correspondingly, the thermal-insulation gap 12-2 is provided between the magnetoresistive angle sensing unit array in the +Y direction and the magnetoresistive angle sensing unit array in the −Y direction, that is, the thermal-insulation gap 12-2 is provided between the magnetoresistive angle sensing unit array 8 and the magnetoresistive angle sensing unit array 10, and between the magnetoresistive angle sensing unit array 9 and the magnetoresistive angle sensing unit array 11. Moreover, the thermal-insulation gap 12-3 is provided between the magnetoresistive angle sensing unit array in the −Y direction and the magnetoresistive angle sensing unit array in the −X direction, that is, the thermal-insulation gap 12-3 is provided between the magnetoresistive angle sensing unit array 10 and the magnetoresistive angle sensing unit array 6, and between the magnetoresistive angle sensing unit array 11 and the magnetoresistive angle sensing unit array 7. The thermal-insulation gap 12 aims to isolate the influence of laser heating on the adjacent magnetoresistive sensing unit arrays with different magnetic field sensitive directions.

Further, the magnetoresistive angle sensing unit arrays in +X, −X, +Y and −Y magnetic field orientations are all composed of the same magnetoresistive angle sensing unit 15. The X push arm, X pull arm, Y push arm and Y pull arm each include the same number of magnetoresistive angle sensing units in +X, −X, +Y and −Y magnetic-sensitive directions, and they are connected into a two-port structure by series, parallel or series-parallel hybrid connection and have the same resistance.

The magnetoresistive angle sensing unit arrays are connected by interconnecting wires 13. The interconnecting wires 13 not connected to the magnetoresistive angle sensing units in the magnetoresistive angle sensing unit arrays are located in a range that a distance 14 to the magnetoresistive sensing unit arrays is greater than 15 um. In particular, the interconnecting wire includes a straight segment and a meandering segment, one end of the straight segment is connected to the magnetoresistive sensing unit, and the other end of the straight segment is connected to the meandering segment. The distance from the meandering segment to the magnetoresistive angle sensing unit array is greater than 15 microns. In addition, the meandering segment 16 of the interconnecting wire aims to increase the interconnecting wire resistance by increasing the total length of the interconnecting wire.

FIG. 2 is a diagram of a magnetic multi-layer film structure of a magnetoresistive angle sensing unit. The magnetoresistive angle sensing unit 20 is a magnetic tunnel junction MTJ or a GMR spin valve, wherein the magnetoresistive angle sensing units of two angle sensors have the same magnetic multi-layer film structure. FIG. 2(a) shows a magnetic multi-layer film structure of a magnetoresistive angle sensing unit, and FIG. 2(b) is an enlarged structural diagram of 100 in FIG. 2(a). The magnetic multi-layer film structure includes a seed layer 23, an anti-ferromagnetic layer 24, a pinning layer 25, Ru 26, a reference layer 27, a non-magnetic intermediate layer 28, a free layer 29, and a passivation layer 30 from the top down. Or, FIG. 2(c) shows another magnetic multi-layer film structure of a magnetoresistive angle sensing unit, and FIG. 2(d) is an enlarged structural diagram of 200 in FIG. 2(c). The magnetic multi-layer film structure includes a seed layer 23, an anti-ferromagnetic layer 24, a reference layer 27, a non-magnetic intermediate layer 28, a free layer 29, and a passivation layer 30 from the top down. For the MTJ, the non-magnetic intermediate layer is $Al_2O_3$ or MgO film, and for the GMR spin valve, the non-magnetic intermediate layer is a metal conductive layer such as Cu and Au film. In both cases, the magnetization direction of the anti-ferromagnetic layer 24 is in the +X and −X directions 31, or in the +Y and −Y directions 32.

Figure 3A:
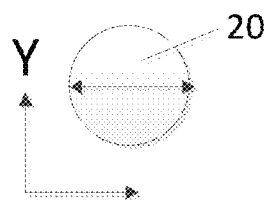
FIG. 3(a) is a top view of a magnetoresistive angle sensing unit of which the magnetization direction of an anti-ferromagnetic layer is in an X direction according to the present invention.
Figure 3B:
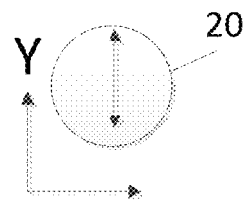
FIG. 3(b) is a top view of a magnetoresistive angle sensing unit of which the magnetization direction of an anti-ferromagnetic layer is in a Y direction according to the present invention.

FIG. 3 is a shape diagram of the magnetoresistive angle sensing unit 20. FIG. 3(a) is a top view of a magnetoresistive angle sensing unit of which the magnetization direction of an anti-ferromagnetic layer is in an X direction, and FIG. 3(b) is a top view of a magnetoresistive angle sensing unit of which the magnetization direction of an anti-ferromagnetic layer is in a Y direction. As seen from FIG. 3(a) and FIG. 3(b), both are circular structures, and the magnetization directions of the anti-ferromagnetic layers are along the +X, −X directions and the +Y, −Y directions, respectively. In order to ensure the normal operation of the double-axis magnetoresistive angle sensor, considering that the possible deviation from the circular shape, thermal stress, and dispersion of anisotropy of the magnetoresistive angle sensing unit may cause deviation of the actual magnetization direction of the pinning layer from the +X, −X, +Y and −Y directions, it is further required that an angular orientation range between the pinning layers of the magnetoresistive sensing units having X-axis and Y-axis sensitive directions is between 85° and 95°.

Figure 4A:
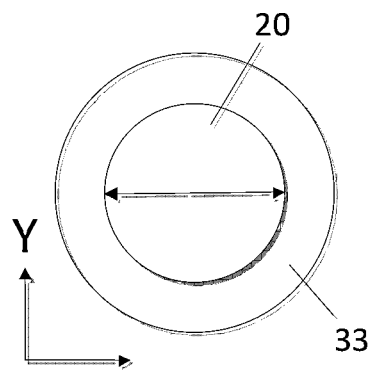
FIG. 4(a) is a top view of a high-field-intensity magnetoresistive angle sensing unit of which the magnetization direction of a pinning layer is in an X direction according to the present invention.
Figure 4B:
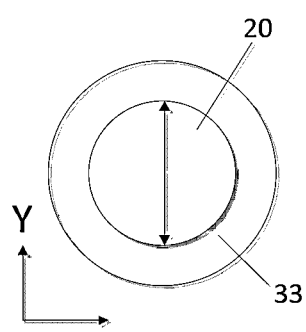
FIG. 4(b) is a top view of a high-field-intensity magnetoresistive angle sensing unit of which the magnetization direction of a pinning layer is in a Y direction according to the present invention.
Figure 5A:
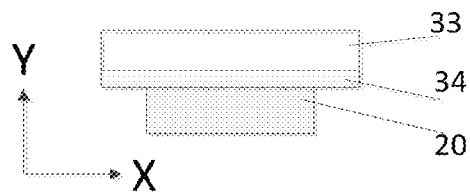
FIG. 5(a) is a side view of a high-field-intensity magnetoresistive angle sensing unit of which the magnetization direction of a pinning layer is in an X direction according to the present invention.
Figure 5B:
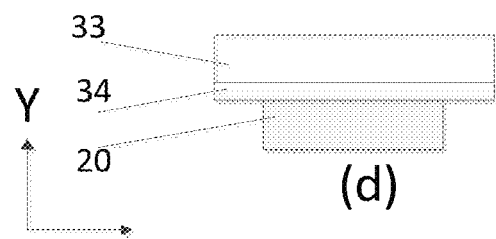
FIG. 5(b) is a side view of a high-field-intensity magnetoresistive angle sensing unit of which the magnetization direction of a pinning layer is in a Y direction according to the present invention.

FIG. 4 is a top view of a high-field-intensity magnetoresistive angle sensing unit. Specifically, FIG. 4(a) is a top view of a high-field-intensity magnetoresistive angle sensing unit of which the magnetization direction of a pinning layer is in an X direction. FIG. 4(b) is a top view of a high-field-intensity magnetoresistive angle sensing unit of which the magnetization direction of a pinning layer is in a Y direction. Corresponding to FIG. 4, FIG. 5 is a side view of a high-field-intensity magnetoresistive angle sensing unit. Specifically, FIG. 5(a) is a side view of a high-field-intensity magnetoresistive angle sensing unit of which the magnetization direction of a pinning layer is in an X direction. FIG. 5(b) is a side view of a high-field-intensity magnetoresistive angle sensing unit of which the magnetization direction of a pinning layer is in a Y direction. As seen from FIG. 4 and FIG. 5, the high-field-intensity magnetoresistive angle sensing unit includes a magnetoresistive angle sensing unit 20 and a magnetic attenuation layer 33 located on the upper surface or the lower surface of the magnetoresistive angle sensing unit, wherein an insulating layer 34 is located between the magnetic attenuation layer 33 and the magnetoresistive angle sensing unit 20. The magnetic attenuation layer 33 is made of a high-permeability soft magnetic alloy material, including one or more of Fe, Co, and Ni elements. Only after the laser program-control heating magnetic annealing of all magnetoresistive angle sensing units 20 is completed, can the magnetic attenuation material layer 33 be electroplated on the surface of the magnetoresistive angle sensing unit to obtain a high-field-intensity magnetoresistive angle sensor.

Specifically, the magnetic field attenuation layer 33 is electroplated on the surface of the magnetoresistive angle sensing unit 20 to form a high-magnetic-field angle sensor. The magnetic field attenuation layer 33 is of a circular structure, and the magnetoresistive angle sensing unit 20 is an elliptical or circular structure. If the magnetoresistive angle sensing unit 20 is elliptical, the diameter of the magnetic field attenuation layer 33 is greater than the major axis distance of the magnetoresistive angle sensing unit 20. If the magnetoresistive angle sensing unit 20 is of a circular structure, the diameter of the magnetic field attenuation layer 33 is larger than that of the magnetoresistive angle sensing unit 20, and at this time, the magnetoresistive angle sensing unit 20 has a diameter greater than 10 microns.

The passivation layer is made of an ultraviolet laser transparent material, including BCB, $Si_3N_4$, $Al_2O_3$, $HfO_2$, $AlF_3$, $GdF_3$, $LaF_3$, $MgF_2$, $Sc_2O_3$, $HfO_2$ or $SiO_2$.

The passivation layer is made of an infrared laser transparent material, including a diamond-like carbon film, MgO, SiN, SiC, $AlF_3$, $MgF_2$, $SiO_2$, $Al_2O_3$, $ThF_4$, ZnS, ZnSe, $ZrO_2$, $HfO_2$, $TiO_2$, $Ta_2O_7$, Si, or Ge.

An anti-reflective coating is added to the surface of the passivation layer.

The power supplies, ground, and output pins of the X-axis magnetoresistive angle sensor and the Y-axis magnetoresistive angle sensor are arranged along one side of the rectangular chip.

Figure 6A:
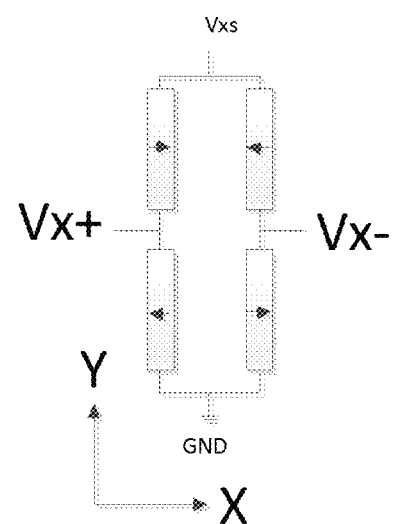
FIG. 6(a) is a structural diagram of a magnetoresistive angle sensor in a push-pull X-axis according to the present invention.
Figure 6B:
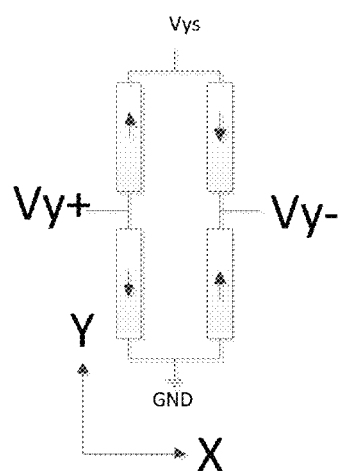
FIG. 6(b) is a structural diagram of a magnetoresistive angle sensor in a push-pull Y-axis according to the present invention.

FIG. 6 is a structural diagram of a push-pull double-axis magnetoresistive angle sensor, which can be a half-bridge, full-bridge or quasi-bridge structure. FIG. 6(a) is a full-bridge structural diagram of a magnetoresistive angle sensor in a push-pull X-axis, FIG. 6(b) is a full-bridge structural diagram of a magnetoresistive angle sensor in a push-pull Y-axis.

Figure 7:
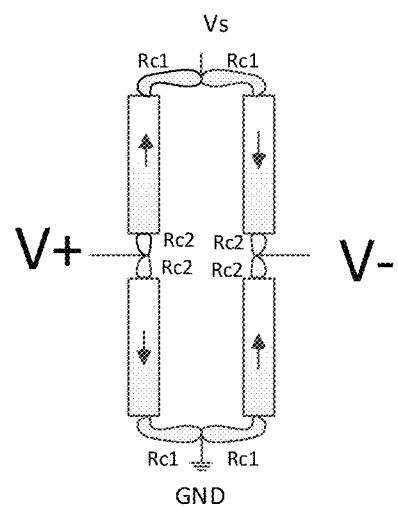
FIG. 7 is a distribution diagram of interconnection resistances of a push-pull magnetoresistive angle sensor according to the present invention.

FIG. 7 is a distribution diagram of interconnection resistances of a push-pull magnetoresistive angle sensor. For a magnetoresistive angle sensor in a push-pull X-axis or a magnetoresistive angle sensor in a push-pull Y-axis, regardless of a push-pull full-bridge or half-bridge circuit, the interconnecting wires connecting a common power supply terminal Vs and the push arm and the pull arm and the interconnecting wires connecting a common ground terminal GND and the push arm and the pull arm have the same interconnection resistance Rc1. The interconnecting wires connecting common signal output terminals V+, V− and the push arm and the pull arm have the same interconnection resistance Rc2. All the push arms and the pull arms have the same resistance. As such, the magnetoresistive angle sensor in a push-pull X-axis or the magnetoresistive angle sensor in a push-pull Y-axis can be guaranteed to output a zero-voltage signal when the magnetic field is zero. To achieve this objective, the interconnecting wire is realized by a straight segment or a meandering segment. As shown in FIG. 1, the meandering segment 16 increases the resistance to obtain the same interconnection resistance.

FIG. 8 is a distribution diagram of +X, −X, +Y, −Y magnetoresistive angle sensing unit arrays of the double-axis magnetoresistive angle sensor shown in FIG. 1. In order to ensure that the distributions of the +X, −X, +Y, −Y magnetoresistive angle sensing unit arrays of the X push-pull magnetoresistive angle sensor and the Y push-pull magnetoresistive angle sensor have a common geometric center, FIG. 8(a) is a distribution structural diagram of magnetoresistive angle sensing unit arrays having a +Y, +X, −X, −Y distribution structure, FIG. 8(b) is a distribution structural diagram of magnetoresistive angle sensing unit arrays having a −Y, +X, −X, +Y distribution structure, FIG.

Figure 8A:
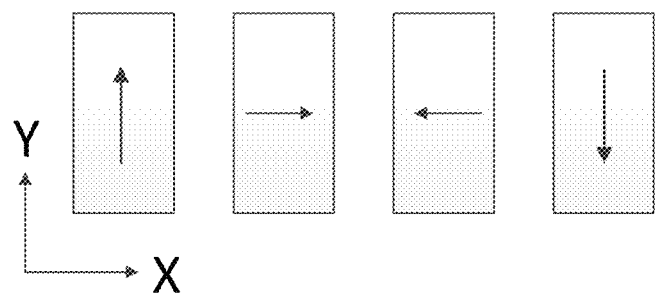
FIG. 8(a) is a distribution structural diagram of a magnetoresistive angle sensing unit array according to the present invention.
Figure 8B:
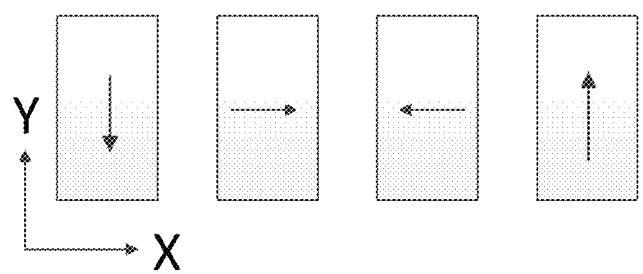
FIG. 8(b) is another distribution structural diagram of a magnetoresistive angle sensing unit array according to the present invention.
Figure 8C:
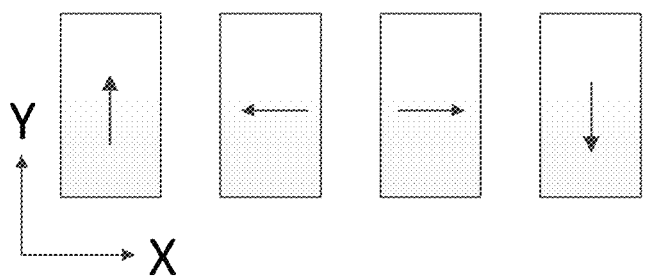
FIG. 8(c) is another distribution structural diagram of a magnetoresistive angle sensing unit array according to the present invention.
Figure 8D:
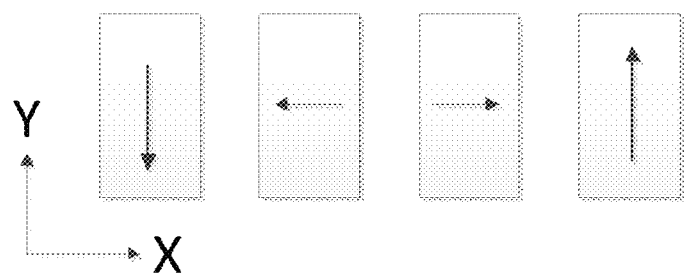
FIG. 8(d) is another distribution structural diagram of a magnetoresistive angle sensing unit array according to the present invention.

8(c) is a distribution structural diagram of magnetoresistive angle sensing unit arrays having a +Y, −X, +X, −Y structure, and FIG. 8(d) is a distribution structural diagram of magnetoresistive angle sensing unit arrays having a −Y, −X, +X, +Y structure. Magnetoresistive bridge arms with the same magnetization direction are arranged adjacent to each other for facilitating laser program-control operation.

In summary, the magnetoresistive angle sensor of the present invention includes a magnetoresistive angle sensor in a push-pull X-axis and a magnetoresistive angle sensor in a push-pull Y-axis, and the two angle sensors are integrated on the same chip to achieve a small overall size and a compact structure. The X-axis magnetoresistive angle sensor and the Y-axis magnetoresistive angle sensor have a common geometric center, and the magnetoresistive angle sensing units of the two angle sensors have the same magnetic multi-layer film structure. As such, magnetic-field regions of the two angular sensors measured on the substrate have the same average value. Therefore, the sensor has low power consumption as a whole. The magnetic field attenuation layer can also be deposited on the surface of the magnetoresistive angle sensing unit to increase the working magnetic field range. Further, a thermal-insulation gap is provided between two adjacent magnetoresistive sensing unit arrays with different magnetic field sensitive directions, and the thermal-insulation gap can isolate the adjacent magnetoresistive sensing unit arrays with different magnetic field sensitive directions from affecting each other. In short, the present invention is advantageous in compact structure, high precision, small size, and capability of realizing a large magnetic field working range.

The above description is only preferred embodiments of the present invention and is not intended to limit the present invention, and various modifications and variations can be made to the present invention by those skilled in the art. Any modifications, equivalent replacements, improvements, etc. within the spirit and principle of the present invention shall be included in the protection scope of the present invention.

The invention claimed is:

1. A single-chip double-axis magnetoresistive angle sensor, comprising:
    a substrate in an X-Y plane;
    a push-pull X-axis magnetoresistive angle sensor aligned along an X-axis; and
    a push-pull Y-axis magnetoresistive angle sensor aligned along a Y-axis,
    wherein both the push-pull X-axis magnetoresistive angle sensor and the push-pull Y-axis magnetoresistive angle sensor are located on the substrate,
    wherein the push-pull X-axis magnetoresistive angle sensor comprises an X push arm and an X pull arm,
    wherein the push-pull Y-axis magnetoresistive angle sensor comprises a Y push arm and a Y pull arm,
    wherein each of the X push arm, the X pull arm, the Y push arm, and the Y pull arm comprises at least one +X array, at least one −X array, at least one +Y array, and at least one −Y array, respectively, and wherein magnetic field sensitive directions of the arrays of the X push arm, the X pull arm, the Y push arm, and the Y pull arm being along +X, −X, +Y, and −Y directions, respectively,
    wherein the push-pull X-axis magnetoresistive angle sensor includes at least two +X arrays symmetrically arranged on opposing sides of an X center line and at least two −X arrays symmetrically arranged on opposing sides of the X center line, and wherein the at least two +X arrays and the at least two −X arrays are symmetrically arranged on opposing sides of a Y center line,
    wherein the push-pull Y-axis magnetoresistive angle sensor includes at least two +Y arrays symmetrically arranged on opposing sides of the X center line and at least two −Y arrays symmetrically arranged on opposing sides of the X center line, and wherein the at least two +Y arrays and the at least two −Y arrays are symmetrically arranged on opposing sides of the Y center line,
    wherein the push-pull X-axis magnetoresistive angle sensor and the push-pull Y-axis magnetoresistive angle sensor have a common geometric center at an intersection of the X center line and the Y center line,
    wherein the magnetoresistive angle sensor is TMR where a non-magnetic intermediate layer is $Al_2O_3$ or $MgO$, and the magnetoresistive angle sensing unit is a GMR spin valve where a non-magnetic intermediate layer is Au or Cu, and
    wherein a magnetization direction of an anti-ferromagnetic layer is obtained by laser program-control heating magnetic annealing, magnetoresistive bridge arms with the same magnetization direction are located adjacent to each other, and a thermal-insulation gap is provided between adjacent ones of the +X, −X, +Y, and −Y arrays.

2. The single-chip double-axis magnetoresistive angle sensor according to claim 1, wherein the push-pull X-axis magnetoresistive angle sensor and the push-pull Y-axis magnetoresistive angle sensor Y-axis are a half-bridge, full-bridge or quasi-bridge structure.

3. The single-chip double-axis magnetoresistive angle sensor according to claim 1, wherein the magnetoresistive angle sensing unit arrays are arranged as:
    +X, −Y, +Y, −X;
    or +X, +Y, −Y, −X;
    or −X, −Y, +Y, +X;
    or +X, −Y, +Y, −X.

4. The single-chip double-axis magnetoresistive angle sensor according to claim 1,
    wherein a magnetic field attenuation layer is electroplated on the surface of the magnetoresistive angle sensing unit to form a high magnetic field angle sensor,
    wherein the material of the magnetic field attenuation layer is a high-permeability soft magnetic alloy that contains one or more of Fe, Co, and Ni elements, and an insulating material layer is provided between the magnetoresistive angle sensing unit and the magnetic field attenuation layer, and
    wherein the magnetic field attenuation layer is of a circular structure, the magnetoresistive angle sensing unit is of an elliptical structure, and the diameter of the magnetic field attenuation layer is greater than the major axis distance of the magnetoresistive angle sensing unit.

5. The single-chip double-axis magnetoresistive angle sensor according to claim 1,
    wherein a magnetic field attenuation layer is electroplated on the surface of the magnetoresistive angle sensing unit to form a high magnetic field angle sensor, and
    wherein the magnetic field attenuation layer is of a circular structure, the magnetoresistive angle sensing unit is of a circular structure, the diameter of the magnetoresistive angle sensing unit is greater than 10 microns, and the diameter of the magnetic field attenuation layer is greater than that of the magnetoresistive angle sensing unit.

6. The single-chip double-axis magnetoresistive angle sensor according to claim 1, wherein the X push arm, the X pull arm, the Y push arm and the Y pull arm comprise the same number of magnetoresistive angle sensing units having the same resistance, and the magnetoresistive angle sensing units form a two-port structure by series, parallel or series-parallel hybrid connection.

7. The single-chip double-axis magnetoresistive angle sensor according to claim 2,
wherein the magnetoresistive angle sensing unit arrays are connected by interconnecting wires,
wherein the interconnecting wires each comprise a straight segment and a meandering segment, and
wherein one end of the straight segment is connected to the magnetoresistive sensing unit, the other end of the straight segment is connected to the meandering segment, and the distance from the meandering segment to the magnetoresistive angle sensing unit array is greater than 15 microns.

8. The single-chip double-axis magnetoresistive angle sensor according to claim 7,
wherein an interconnecting wire connecting a common power supply terminal has the same interconnection resistance as an interconnecting wire connecting a common ground terminal,
wherein the interconnecting wire connecting the common power supply terminal has the same interconnection resistance as an interconnecting wire connecting a common signal output terminal, and
wherein the interconnecting wires obtain the same interconnection resistance through the straight segments and the meandering segments.

9. The single-chip double-axis magnetoresistive angle sensor according to claim 1, wherein the magnetoresistive angle sensor includes a pinning layer with a magnetization direction, and wherein an included angle between the magnetic field sensitive direction of the magnetoresistive angle sensing unit and the magnetization direction of the pinning layer ranges from 85° to 95°.

10. The single-chip double-axis magnetoresistive angle sensor according to claim 1, wherein the magnetoresistive angle sensor includes a pinning layer with a magnetization direction, and wherein the passivation layer is an ultraviolet laser transparent material that is BCB, $Si_3N_4$, $Al_2O_3$, $HfO_2$, $AlF_3$, $GdF_3$, $LaF_3$, $MgF_2$, $Sc_2O_3$, $HfO_2$, or $SiO_2$.

11. The single-chip double-axis magnetoresistive angle sensor according to claim 1, wherein the magnetoresistive angle sensor includes a pinning layer with a magnetization direction, and wherein the passivation layer is an infrared laser transparent material that is a diamond-like carbon film, MgO, SiN, SiC, $AlF_3$, $MgF_2$, $SiO_2$, $Al_2O_3$, $ThF_4$, ZnS, ZnSe, $ZrO_2$, $Hfn_2$, $TiO_2$, $Ta_2O_7$, Si, or Ge.

12. The single-chip double-axis magnetoresistive angle sensor according to claim 1, wherein the magnetoresistive angle sensor includes a passivation layer, and wherein the magnetoresistive angle sensor further comprises an anti-reflective coating covering a surface of the passivation layer.

13. The single-chip double-axis magnetoresistive angle sensor according to claim 1, wherein power supplies, ground, and output pins of the X-axis magnetoresistive angle sensor and the Y-axis magnetoresistive angle sensor are arranged along an edge of a sensor chip.

\* \* \* \* \*